United States Patent
Hung et al.

(10) Patent No.: US 9,029,976 B1
(45) Date of Patent: May 12, 2015

(54) SEMICONDUCTOR DEVICE AND METHOD OF FABRICATING THE SAME

(71) Applicant: MACRONIX International Co., Ltd., Hsinchu (TW)

(72) Inventors: Chih-Ling Hung, Hsinchu (TW); Hsin-Liang Chen, Hsinchu (TW); Wing-Chor Chan, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/142,047

(22) Filed: Dec. 27, 2013

(51) Int. Cl.
*H01L 23/58* (2006.01)
*H01L 29/40* (2006.01)
*H01L 29/66* (2006.01)
*H01L 29/735* (2006.01)
*H01L 29/06* (2006.01)

(52) U.S. Cl.
CPC .......... *H01L 29/402* (2013.01); *H01L 29/6625* (2013.01); *H01L 29/735* (2013.01); *H01L 29/0623* (2013.01)

(58) Field of Classification Search
CPC ... H01L 23/58; H01L 23/485; H01L 23/7813; H01L 29/402; H01L 29/404

USPC .......... 257/488, 491, 565, E21.609; 438/309, 438/478
See application file for complete search history.

(56) References Cited

U.S. PATENT DOCUMENTS

| | | | |
|---|---|---|---|
| 2003/0127687 A1* | 7/2003 | Kumagai et al. | 257/335 |
| 2013/0341715 A1* | 12/2013 | McGregor | 257/336 |
| 2014/0266407 A1* | 9/2014 | Chen et al. | 327/534 |

* cited by examiner

*Primary Examiner* — Phuc Dang
(74) *Attorney, Agent, or Firm* — J.C. Patents

(57) ABSTRACT

Provided is a semiconductor device which increases a concentration around an emitter by arranging a lightly doped region (HNMLDD). When the semiconductor device is operated in a forward bias, a maximum common-emitter current gain is obtained in a forward-active region, such that signals are amplified and an unnecessary noise is decreased at the same time. Further, the semiconductor device of the invention further includes a field plate disposed on a substrate between the emitter and a base or/and the collector and the base, and configured to change a potential distribution of junctions between each of doped regions and raise a breakdown voltage of the junctions.

19 Claims, 6 Drawing Sheets

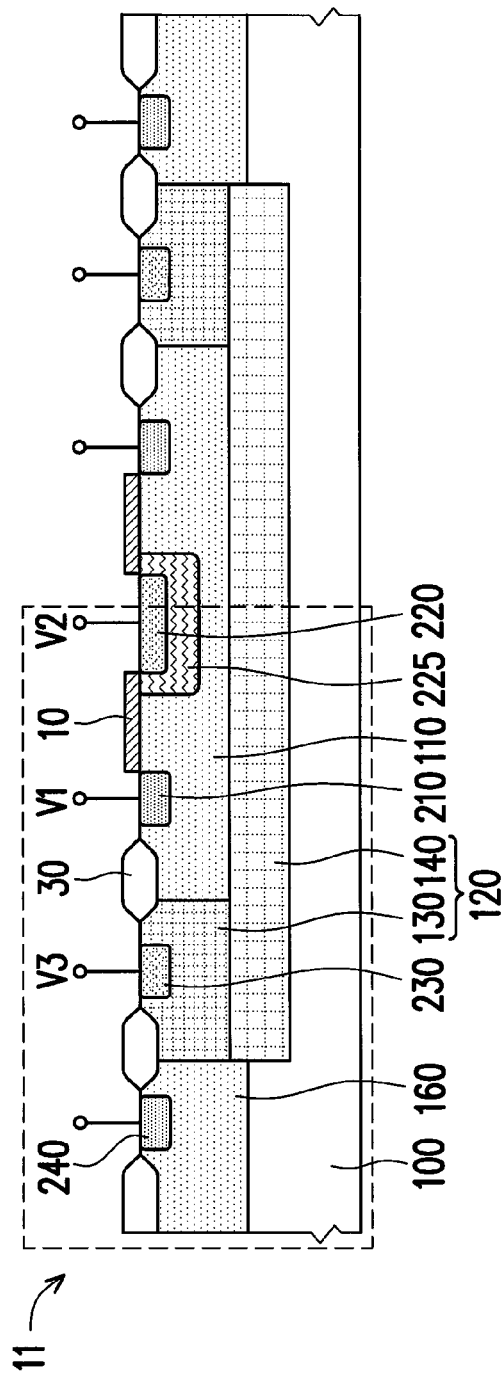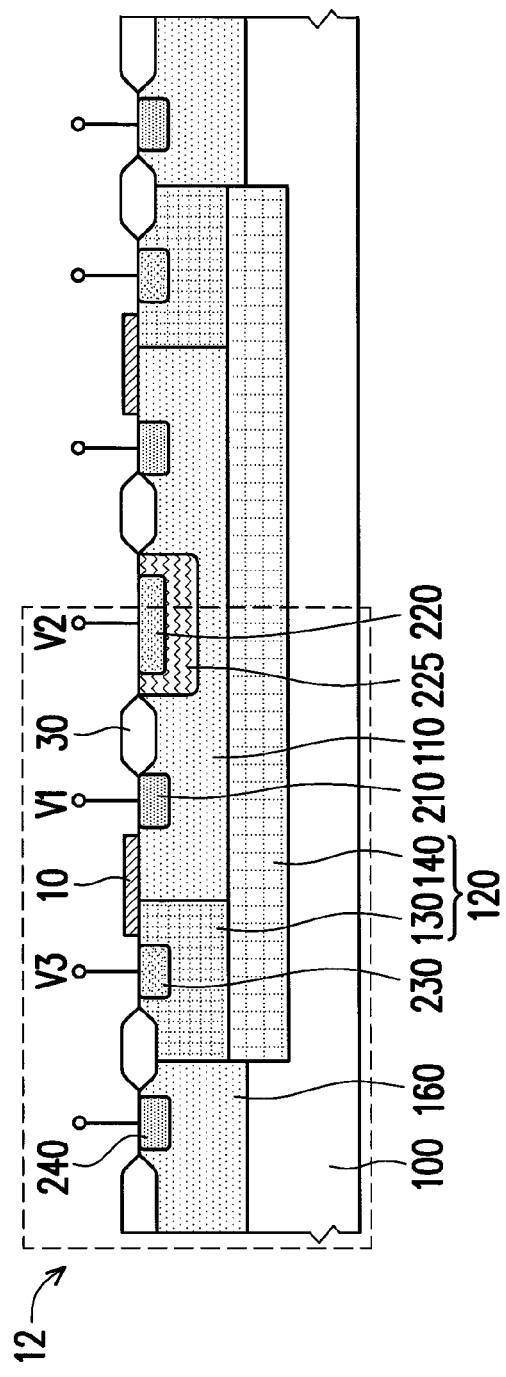

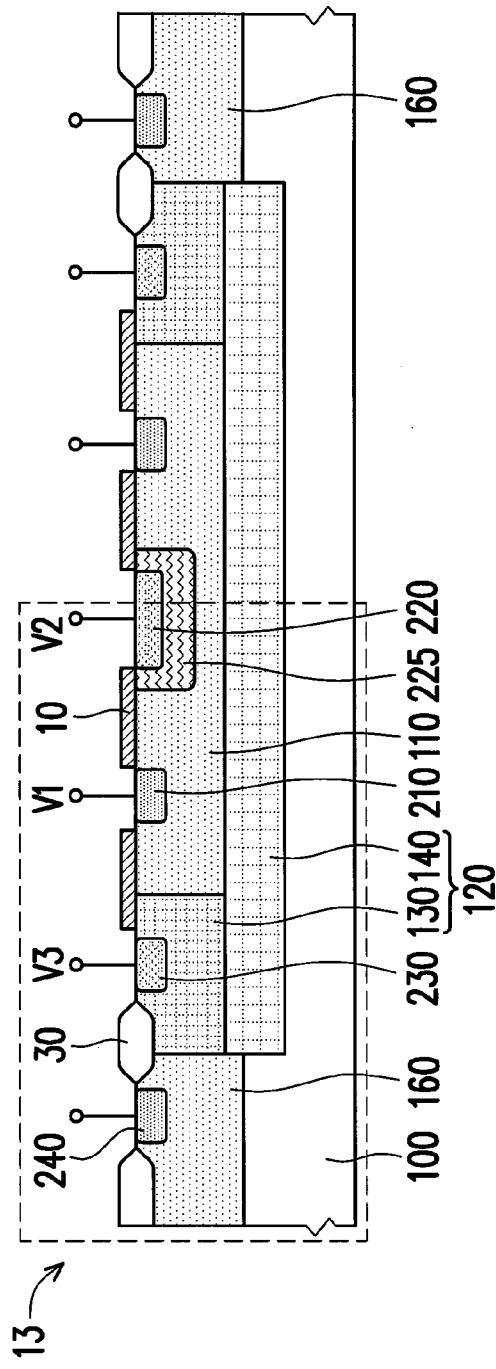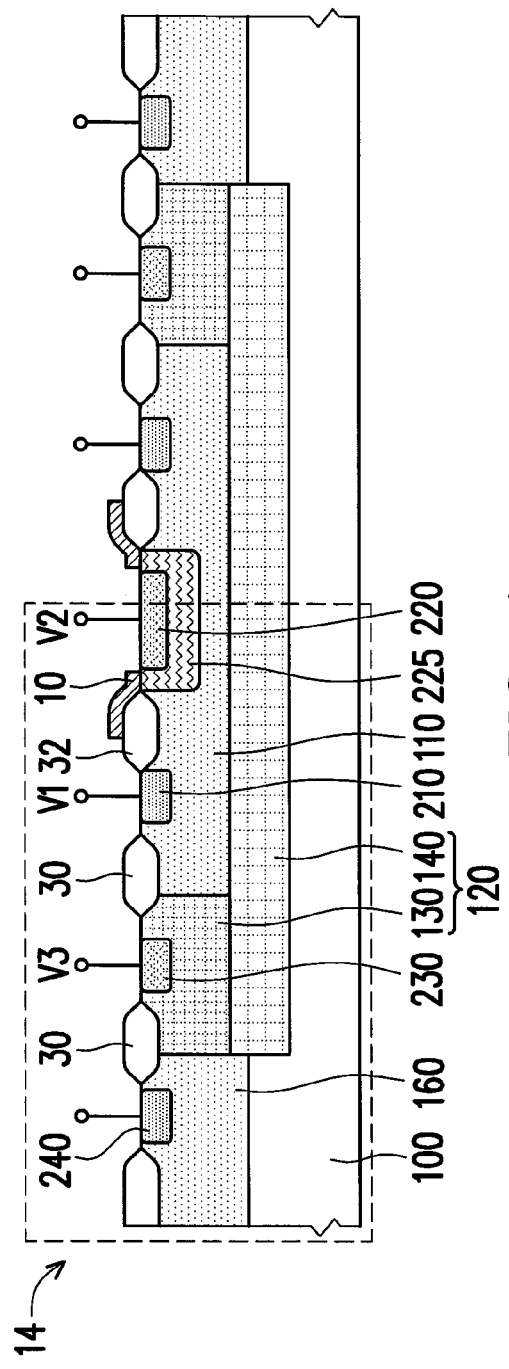

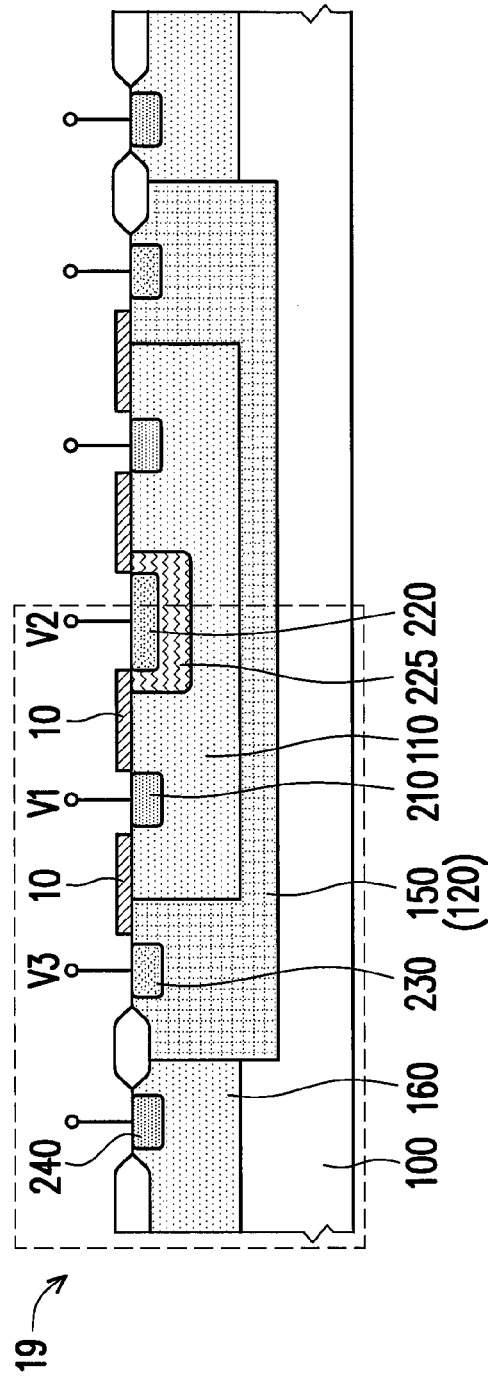
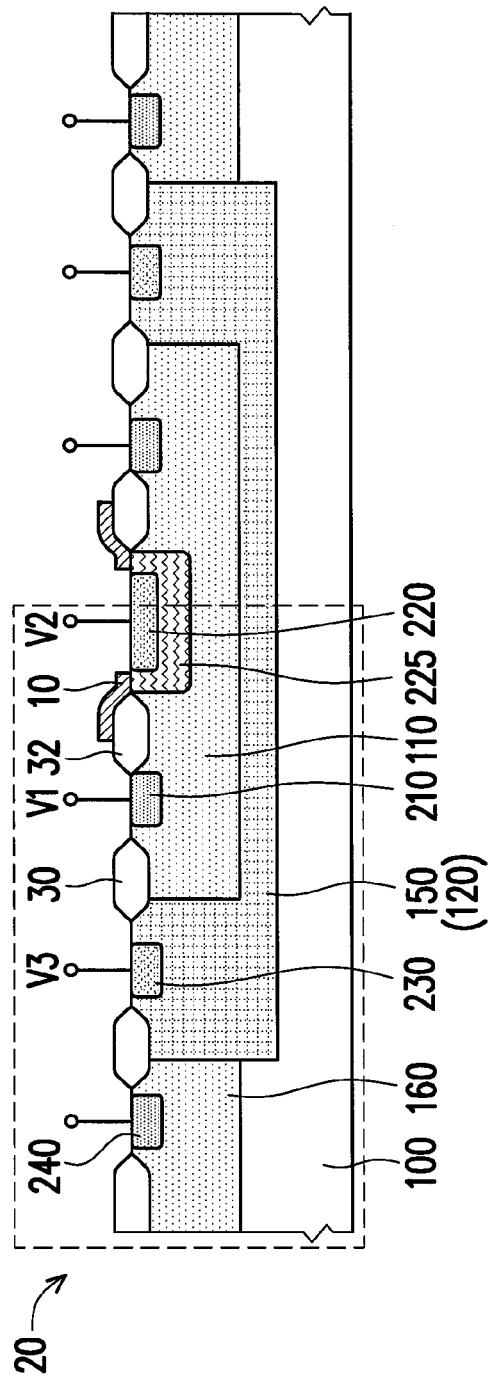

SEMICONDUCTOR DEVICE AND METHOD OF FABRICATING THE SAME

BACKGROUND OF THE INVENTION

1. Field of the Invention

The invention relates to a semiconductor and a method of fabricating the same.

2. Description of Related Art

A transistor is a solid state semiconductor device advantageous in small size, high efficiency, long lifetime and high speed. In recent years, with advancement in technologies, the transistor is now capable of enduring high voltage and high power, and becoming an important role in a high power device.

A bipolar junction transistor (BJT) refers to a transistor composed of two PN junctions formed by utilizing three different doped regions. The BJT is a device having three terminals including an emitter (E), a base (B) and a collector (C). The BJT is capable of amplifying signals, and providing more preferable power control, high speed operation and endurance capacity. Thus, the BJT is widely used by circuits with current control requirements in fields including a switch device controlling a DC power load, an analog signal amplifier, a 3D bipolar simulation, a NPN element, and an AC frequency response. The BJT is also an important device in an ultra high speed discrete logic circuit including applications such as an emitter coupled logic (ECL), a power switching device, and a microwave power amplifier. How to amplify the signal, reduce noises while maintaining a high breakdown voltage is one of the issues to be solved in applications of amplifiers.

SUMMARY OF THE INVENTION

The invention is directed to a semiconductor device and a method of fabricating the semiconductor device, which may improve a common-emitter current gain of the semiconductor device while maintaining a high breakdown voltage of the device.

The invention provides a semiconductor device, which includes: a substrate of a first conductive type, a first well region of the first conductive type, a separation region of a second conductive type, a first doped region of the first conductive type, a second doped region of the second conductive type, a third doped region of the second conductive type and at least one field plate. The separation region is disposed in the substrate, and the first well region is disposed in the separation region. The first doped region is disposed in the first well region and applied with a first voltage. The second doped region is disposed in the first well region at a first side of the first doped region, and applied with a second voltage. The third doped region is disposed in the separation region at a second side of the first doped region, and applied with a third voltage. At least one field plate is disposed on the substrate between the first doped region and the second doped region, or disposed on the substrate between the first doped region and the third doped region, or disposed on the substrate between the first doped region and the second doped region and between the first doped region and the third doped region.

In an embodiment of the invention, the separation region includes a second well region of the second conductive type and a buried layer of the second conductive type. The second well region is disposed at peripheral of the first well region. The buried layer is disposed in the substrate below the first well region and the second well region, and a doping concentration of the buried layer is different from a doping concentration of the second well region.

In an embodiment of the invention, the separation region includes a deep well region of the second conductive type.

In an embodiment of the invention, when the first conductive type is a P type, the second conductive type is an N type, the third voltage is greater than the first voltage and the first voltage is greater than the second voltage.

In an embodiment of the invention, when the first conductive type is the N type, the second conductive type is the P type, the second voltage is greater than the first voltage and the first voltage is greater than third voltage.

In an embodiment of the invention, the semiconductor device further includes at least one isolation structure disposed below the at least one field plate, and the at least one field plate covers a part of the at least one isolation structure.

In an embodiment of the invention, a material of the at least one field plate includes a polysilicon, a metal or a combination thereof.

The invention provides a semiconductor device, which includes: a substrate of a first conductive type, a first well region of the first conductive type, a separation region of a second conductive type, a first doped region of the first conductive type, a lightly doped region of the second conductive type, a second doped region of the second conductive type, a third doped region of the second conductive type and at least one field plate. The first well region and the separation region are disposed in the substrate, in which the first well region is disposed in the separation region. The first doped region is disposed in the first well region. The lightly doped region is disposed in the first well region. The second doped region is disposed in the lightly doped region at the first side of the first doped region. The third doped region is disposed in the separation region at a second side of the first doped region. At least one field plate is disposed on the substrate between the first doped region and the second doped region and in contact with the lightly doped region, or disposed on the substrate between the first doped region and the third doped region, or disposed on the substrate between the first doped region and the third doped region, and between the first doped region and the second doped region and in contact with the lightly doped region.

In an embodiment of the invention, the separation region includes a second well region of the second conductive type and a buried layer of the second conductive type. The second well region is disposed at peripheral of the first well region. The buried layer is disposed in the substrate below the first well region and the second well region, and a doping concentration of the buried layer is different from a doping concentration of the second well region.

In an embodiment of the invention, the separation region includes a deep well region of the second conductive type.

In an embodiment of the invention, a doping concentration of the lightly doped region is between the doping concentration of the separation region and the doping concentration of the second doped region.

In an embodiment of the invention, when the first conductive type is a P type, the second conductive type is an N type, and when the first conductive type is the N type, the second conductive type is the P type.

In an embodiment of the invention, the semiconductor device further includes at least one isolation structure disposed below the at least one field plate, and the at least one field plate covers a part of the at least one isolation structure.

In an embodiment of the invention, a material of the at least one field plate includes a polysilicon, a metal or a combination thereof.

The invention also provides a method of fabricating a semiconductor device. A substrate of a first conductive type is provided. A first well region of the first conductive type is formed in the substrate. A separation region of a second conductive type is formed in the substrate, in which the first well region is disposed in the separation region. A first doped region of the first conductive type is formed in the first well region. A lightly doped region of the second conductive type is formed in the first well region. A second doped region of the second conductivity type is formed in the lightly doped region at a first side of the first doped region. A third doped region of the second conductivity type is formed in the separation region at a second side of the first doped region. At least one field plate is formed on the substrate between the first doped region and the second doped region and in contact with the lightly doped region, or on the substrate between the first doped region and the third doped region, or on the substrate between the first doped region and the third doped region and between the first doped region and the second doped region in contact with the lightly doped region.

In an embodiment of the invention, the step of forming the separation region includes: forming a second well region of the second conductive type at peripheral of the first well region; forming a buried layer of the second conductive type in the substrate below the first well region and the second well region. A doping concentration of the buried layer is different from a doping concentration of the second well region.

In an embodiment of the invention, the step of forming the separation region includes forming a deep well region of the second conductive type.

In an embodiment of the invention, the method of fabricating the semiconductor device further includes forming at least one isolation structure disposed below the at least one field plate, and the at least one field plate covers a part of the at least one isolation structure.

In an embodiment of the invention, a material of the at least one field plate includes a polysilicon, a metal or a combination thereof.

In an embodiment of the invention, a doping concentration of the lightly doped region is between the doping concentration of the separation region and the doping concentration of the second doped region.

The semiconductor device of the invention may be applied on the DC circuit device as well as on an electrostatic discharge protection device.

The fabricating method of the semiconductor device of the invention is compatible with existing standard processes without adding extra photomask, and capable of raising the breakdown voltage.

To make the above features and advantages of the disclosure more comprehensible, several embodiments accompanied with drawings are described in detail as follows.

BRIEF DESCRIPTION OF THE DRAWINGS

FIG. 1 is a cross-sectional diagram of a semiconductor device according to first embodiment of the invention.

FIG. 2 is a cross-sectional diagram of a semiconductor device according to second embodiment of the invention.

FIG. 3 is a cross-sectional diagram of a semiconductor device according to third embodiment of the invention.

FIG. 4 is a cross-sectional diagram of a semiconductor device according to fourth embodiment of the invention.

FIG. 9 is a cross-sectional diagram of a semiconductor device according to ninth embodiment of the invention.

FIG. 10 is a cross-sectional diagram of a semiconductor device according to tenth embodiment of the invention.

DESCRIPTION OF THE EMBODIMENTS

Figure 5:
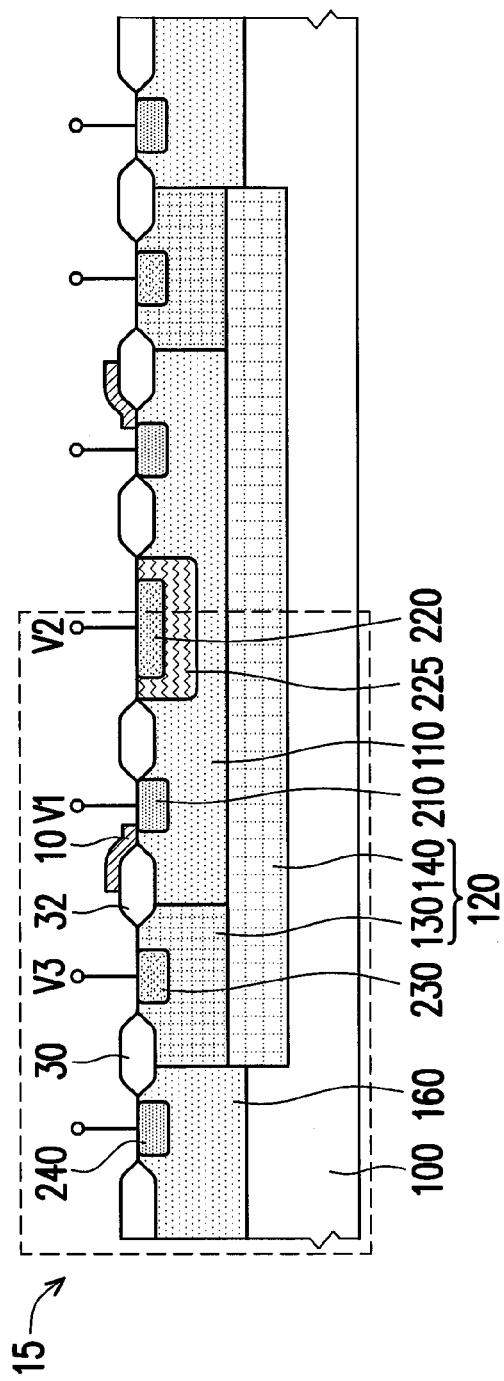
FIG. 5 is a cross-sectional diagram of a semiconductor device according to fifth embodiment of the invention.

In the following embodiments, when the first conductive type is a P-type, the second conductive type is an N-type; and when the first conductive type is the N-type, the second conductive type is the P-type. A P-type dopant is, for example, boron and boron difluoride. A N-type dopant is, for example, phosphorous or arsenic. The present embodiment may be implemented by the first conductivity type being the P-type and the second conductivity type being the N-type as an example, but the invention is not limited thereto.

In the following embodiments, the term "a" or "an" entity refers to one or more of that entity unless otherwise specifically indicated. More specifically, a field plate, a structure and/or a device as described below may also represent at least one field plate, structure and/or device respectively, but the invention is not limited thereto.

Hereinafter, a bipolar junction transistor (BJT) is used as an example for illustrating a semiconductor device of invention, but it does not mean that a structure of the semiconductor device is limited only to be the bipolar junction transistor.

FIG. 1 is a cross-sectional diagram of a semiconductor device according to first embodiment of the invention.

Referring to FIG. 1, a semiconductor device 11 according to first embodiment of the invention includes a substrate 100 of a first conductive type, a first well region 110 of the first conductive type, a separation region 120 of a second conductive type, a first doped region 210 of the first conductive type, a lightly doped region 225 of the second conductive type, a second doped region 220 of the second conductive type, a third doped region 230 of the second conductive type and at least one field plate 10.

A material of the substrate 100 of the first conductive type is, for example, a semiconductor material. The semiconductor material is, for example, a material composed of at least one material selected form a group consisting of Si, Ge, SiGe, GaP, GaAs, SiC, SiGeC, InAs and InP, a silicon on insulator (SOI), or any other physical structures suitable for the process of the invention.

The first well region 110 of the first conductive type is disposed in the substrate 100. The first well region 110 is, for example, a P-type well region, a P+ buried layer, a P-implant region or a stack layer combined of the above. In an embodiment, a dopant of the first well region 110 is, for example, boron and boron difluoride, and a doping concentration of the first well region 110 is, for example, $8 \times 10^{14}/cm^3$ to $5 \times 10^{17}/cm^3$.

The separation region 120 of the second conductive type is disposed in the substrate 100, and the first well region 110 is disposed in the separation region 120. More specifically, in an embodiment, the separation region 120 includes a second well region 130 of the second conductive type and a buried layer 140 of the second conductive type. The second well region 130 is disposed at peripheral of the first well region 110. The buried layer 140 is disposed in the substrate 100 below the first well region 110 and the second well region 130. A doping concentration of the buried layer 140 may be greater than a doping concentration of the second well region 130. The buried layer 140 is, for example, a N-epi layer, a deep N-type well, or a multiple N+ buried layer stack. The second well region 130 may be, for example, a N-type well, a N+ buried layer, a N-implant region or a stack layer combined of the above. In an embodiment, a dopant of the buried layer 140 and the second well region 130 is, for example, phosphorous or arsenic, and a doping concentration of the buried layer 140 is, for example, $8\times10^{14}/cm^3$ to $8\times10^{17}/cm^3$; a doping concentration of the second well region 130 is, for example, $8\times10^{14}/cm^3$ to $1\times10^{17}/cm^3$.

The semiconductor device 11 of the invention further includes an outer well region 160 of the first conductive type. The outer well region 160 is disposed at peripheral of the separation region 120. The doping concentration of the first well region 110 may be identical to or different from a doping concentration of the outer well region 160. In an embodiment, a dopant of the first well region 110 and the outer well region 160 is, for example, boron and boron difluoride, and a doping concentration of the first well region 110 and the outer well region 160 is, for example, $8\times10^{14}/cm^3$ to $5\times10^{17}/cm^3$.

The first doped region 210 of the first conductive type is disposed in the first well region 110. The first doped region 210 is, for example, a P-type heavy doped (P+) region which may be used as a base. In an embodiment, a dopant of the first doped region 210 is, for example, boron and boron difluoride, and a doping concentration of the first doped region 210 is, for example, $8\times10^{17}/cm^3$ to $4\times10^{20}/cm^3$.

The lightly doped region 225 of the second conductive type is disposed in the first well region 110 at a first side of the first doped region 210. The second doped region 220 of the second conductive type is disposed in the lightly doped region 225 at the first side of the first doped region 210. The lightly doped region 225 is, for example, a N-type lightly doped region; and the second doped region 220 is, for example, a N-type heavy doped (N+) region which may be used as an emitter. In an embodiment, a dopant of the second doped region 220 is, for example, boron and boron difluoride, and a doping concentration of the second doped region 220 is, for example, $8\times10^{17}/cm^3$ to $4\times10^{20}/cm^3$. A doping concentration of the lightly doped region 225 is between the doping concentration of the separation region 120 and the doping concentration of the second doped region 220. More specifically, the doping concentration of the lightly doped region 225 is 1/1000 to 1/100 of the doping concentration of the second doped region 220. In an embodiment, the doping concentration of the lightly doped region 225 is, for example, $8\times10^{14}/cm^3$ to $4\times10^{18}/cm^3$; the doping concentration of the separation region 120 is, for example, $8\times10^{14}/cm^3$ to $8\times10^{17}/cm^3$; the doping concentration of the second doped region 220 is, for example, $8\times10^{17}/cm^3$ to $4\times10^{20}/cm^3$.

The third doped region 230 of the second conductive type is disposed in the separation region 120 at a second side of the first doped region 210. A doping concentration of the third doped region 230 may be identical to or different from a doping concentration of the second doped region 220. The third doped region 230 is, for example, a N-type heavy doped (N+) region which may be used as a collector. In an embodiment, a dopant of the third doped region 230 is, for example, boron and boron difluoride, and a doping concentration of the third doped region 230 is, for example, $8\times10^{17}/cm^3$ to $4\times10^{20}/cm^3$.

The semiconductor device 11 of the invention further includes a fourth doped region 240 of the first conductive type. The fourth doped region 240 is disposed in the outer well region 160. A doping concentration of the fourth doped region 240 may be identical to or different from a doping concentration of the first doped region 210. The fourth doped region 240 is, for example, a P-type heavy doped (P+) region which may be electrically connected to the substrate 100. In an embodiment, a dopant of the fourth doped region 240 is, for example, boron and boron difluoride, and a doping concentration of the fourth doped region 240 is, for example, $8\times10^{17}/cm^3$ to $4\times10^{20}/cm^3$.

The field plate 10 is disposed on the substrate 100 between the first doped region 210 and the second doped region 220 and in contact with the lightly doped region 225. More specifically, the field plate 10 is disposed on the lightly doped region 225 and the first well region 110 and in contact with the lightly doped region 225, which may cover a part of the second doped region 220, or may not cover the second doped region 220 at all. A material of the field plate 10 includes a polysilicon, a metal, or a combination thereof.

In addition, in the semiconductor device 11 of the invention, an isolation structure 30 is disposed on the substrate 100 between each of the doped regions where the field plate 10 is not disposed, respectively. More specifically, the isolation structure 30 may be disposed on the first well region 110 and the second well region 130 between the first doped region 210 and the third doped region 230, on the second well region 130 between the third doped region 230 and the fourth doped region 240, and on the outer well region 160 at outer side of the fourth doped region 240. A material of the isolation structure 30 is, for example, a silicon oxide, a doped silicon oxide, a silicon nitride or a combination thereof.

The semiconductor device 11 of the invention is disposed symmetric to another semiconductor and in a manner of a common-emitter (the second doped region 220) (as shown in FIG. 1). However, the semiconductor device of the invention may also be disposed asymmetric to another semiconductor.

During operations of the semiconductor device 11 according to the present embodiment of the invention, a first voltage V1 may be applied to the first doped region 210; a second voltage V2 may be applied to the second doped region 220, and a third voltage V3 may be applied to the third doped region 230. In an embodiment, the semiconductor device 11 is a NPN type BJT device, the third voltage V3 is greater than the first voltage V1 and the first voltage V1 is greater than the second voltage V2. When the third voltage V3 is greater than the first voltage V1 and the first voltage V1 is greater than the second voltage V2, a junction between the first doped region 210 and the second doped region 220 (e.g., an emitter junction) is of a forward bias, and a junction between the second doped region 220 and the third doped region 230 (e.g., a collector junction) is of a reverse bias. In this case, a forward-active region may obtain a maximum common-emitter current gain (Beta) for amplifying the signals. In another embodiment, the semiconductor device 11 is a PNP type BJT device. In this case, the second voltage V2 is greater than the first voltage V1 and the first voltage V1 is greater than the third voltage V3, and the forward-active region may obtain the maximum common-emitter current gain for amplifying the signals.

The semiconductor device 11 according to the present embodiment of the invention includes the field plate 10 disposed on the substrate 100 between each of the doped regions, so that a potential distribution of the semiconductor may be uniform to raise a breakdown voltage of the junction between the first doped region 210 (e.g., the base) and the second doped region 220 (e.g., the emitter). As a result, the BJT device may be applied in a high voltage semiconductor device and suitable for a DC circuit device in any voltages.

FIG. 2 is a cross-sectional diagram of a semiconductor device according to second embodiment of the invention. Referring to FIG. 2, a semiconductor device 2 of second embodiment is similarly to the semiconductor device 11 of first embodiment, and difference thereof is that the field plate 10 of the second embodiment is disposed on the substrate 100 between the first doped region 210 and the third doped region 230. More specifically, the field plate 10 is disposed on the first well region 110 and the second well region 130. In addition, the isolation structure 30 is disposed on the substrate 100 between each of the doped regions where the field plate 10 is not disposed, such as the substrate 100 between the first doped region 210 and the second doped region 220, the substrate 100 between the third doped region 230 and the fourth doped region 240, and the substrate 100 at outer side of the fourth doped region 240. The field plate 10 of the present embodiment may improve a breakdown voltage of the junction between the first doped region 210 (e.g., the base) and the third doped region 230 (e.g., the collector), so that the potential distribution thereof may be uniform.

FIG. 3 is a cross-sectional diagram of a semiconductor device according to third embodiment of the invention. Referring to FIG. 3, a semiconductor device 3 of third embodiment is similarly to the semiconductor device 11 of first embodiment, and difference thereof is that the field plate 10 of the third embodiment is not only disposed on the lightly doped region 225 and the first well region 110 between the first doped region 210 and the second doped region 220 and in contact with the lightly doped region 225, but also disposed on the first well region 110 and the second well region 130 between the first doped region 210 and the third doped region 230. The field plate 10 may cover a part of the second doped region 220, or may not cover the second doped region 220 at all. In addition, an isolation structure 32 is disposed on the substrate 100 between each of the doped regions where the field plate 10 is not disposed, such as the second well region 130 between the third doped region 230 and the fourth region 240, and the outer well region 160 at outer side of the fourth doped region 240. The field plate 10 of the present embodiment may improve a breakdown voltage of the junction between the first doped region 210 (e.g., the base) and the second doped region 220 (e.g., the emitter), a breakdown voltage of the junction between the first doped region 210 (e.g., the base) and the third doped region 230 (e.g., the collector), so that the potential distribution thereof may be uniform.

In said semiconductor devices 11, 12 and 13, a distance between the second doped region 220 (e.g., the emitter) and the third doped region 230 (e.g., the collector) may be optimized to avoid a lateral punch through. The field plate 10 may be used to separate the first doped region 210 (e.g., the base) from the second doped region 220 (e.g., the emitter), and separate the first doped region 210 (e.g., the base) from the third doped region 230 (e.g., the collector), so that the potential distribution thereof may be uniform. Accordingly, a width of the base (the first doped region 210) may be decreased to reduce an overall size of the device. Moreover, a size of the field plate 10 may also be precisely controlled in the process.

In said semiconductor devices 11, 12 and 13, the lightly doped region (e.g., a HNMLDD) 225 is also disposed at peripheral of the second doped region (e.g., a N+ emitter), namely, the second doped region 220 is disposed in the lightly doped region 225. Since the doping concentration of the lightly doped region 240 is higher than the doping concentration of the first well region 110, the lightly doped region 240 may be disposed to increase the doping concentration at peripheral regions of the second doped region 220, so as to improve a common-emitter current gain of the BJT device. The common-emitter current gain is an important parameter for the BJT device to define an amplifying capacity, once the signals are amplified, the BJT device applied on the amplifier is capable of filtering out unnecessary noises.

In addition, in said semiconductor devices 11 and 13, the field plate 10 disposed between the base (the first doped region 210) and the emitter (e.g. the second doped region 220) may allow the potential distribution of the semiconductor devices 11 and 13 to be uniform thereby raising the breakdown voltage of the junction between the base and the emitter. In said semiconductor devices 12 and 13, the field plate 10 disposed between the base (the first doped region 210) and the collector (e.g. the third doped region 230) may allow the potential distribution of the semiconductor devices 12 and 13 to be uniform thereby raising the breakdown voltage of the junction between the base and the collector. A distance between the collector and the emitter may be optimized to avoid the lateral punch through. Accordingly, in the high voltage semiconductor device, not only may the semiconductor device be applied on the DC circuit device, but also on the electrostatic discharge protection device.

Figure 6:
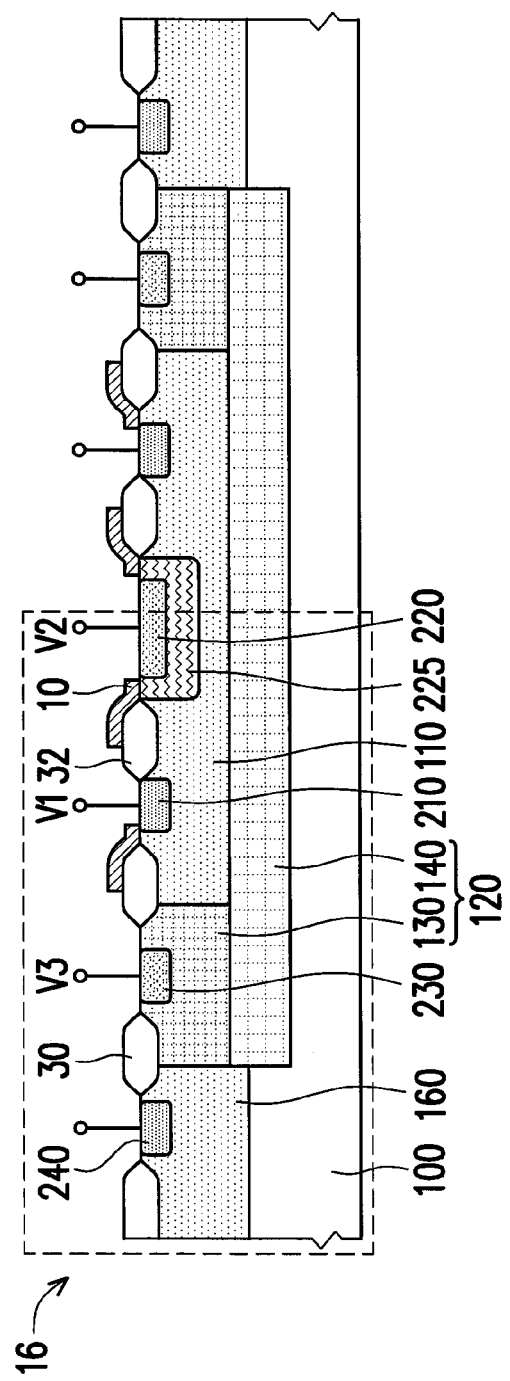
FIG. 6 is a cross-sectional diagram of a semiconductor device according to sixth embodiment of the invention.

FIG. 4 is a cross-sectional diagram of a semiconductor device according to fourth embodiment of the invention. FIG. 5 is a cross-sectional diagram of a semiconductor device according to fifth embodiment of the invention. FIG. 6 is a cross-sectional diagram of a semiconductor device according to sixth embodiment of the invention.

Referring to FIG. 4 to FIG. 6, semiconductor devices 14, 15 and 16 of fourth to sixth embodiments are similarly to the semiconductor devices 11, 12 and 13 of first to third embodiments respectively, and differences thereof are that the semiconductor devices 14, 15 and 16 of fourth to sixth embodiments further include the isolation structure 32 disposed below the field plate 10, so that the field plate 10 covers a part of the isolation structure 32. The isolation structure 32 includes a local oxidation (LOCOS) structure, a shallow trench isolation (STI) structure, and a deep trench isolation (DTI) structure.

Figure 7:
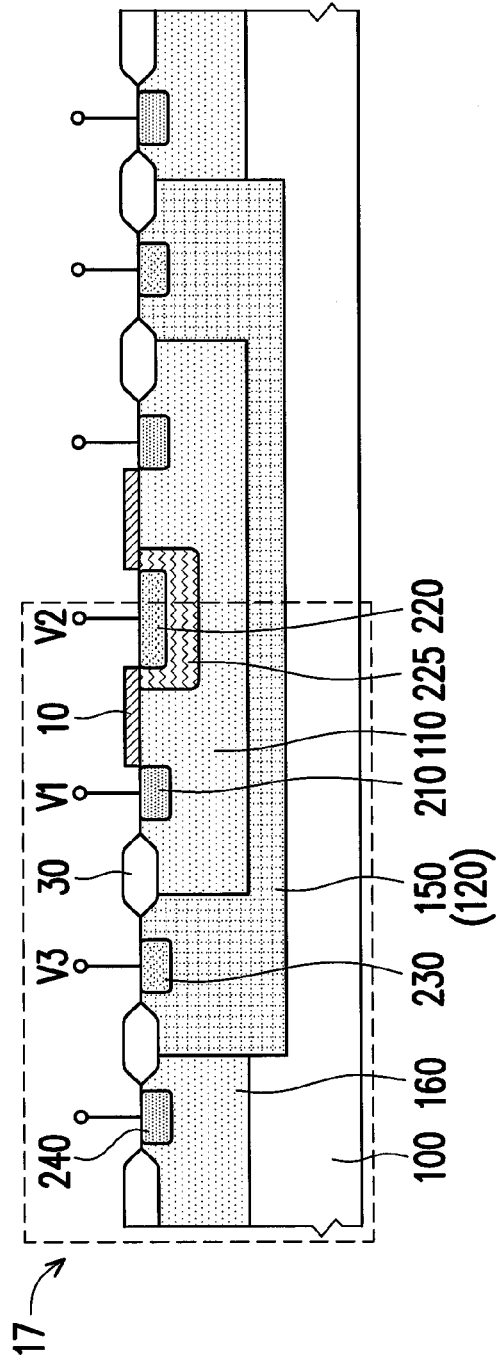
FIG. 7 is a cross-sectional diagram of a semiconductor device according to seventh embodiment of the invention.
Figure 8:
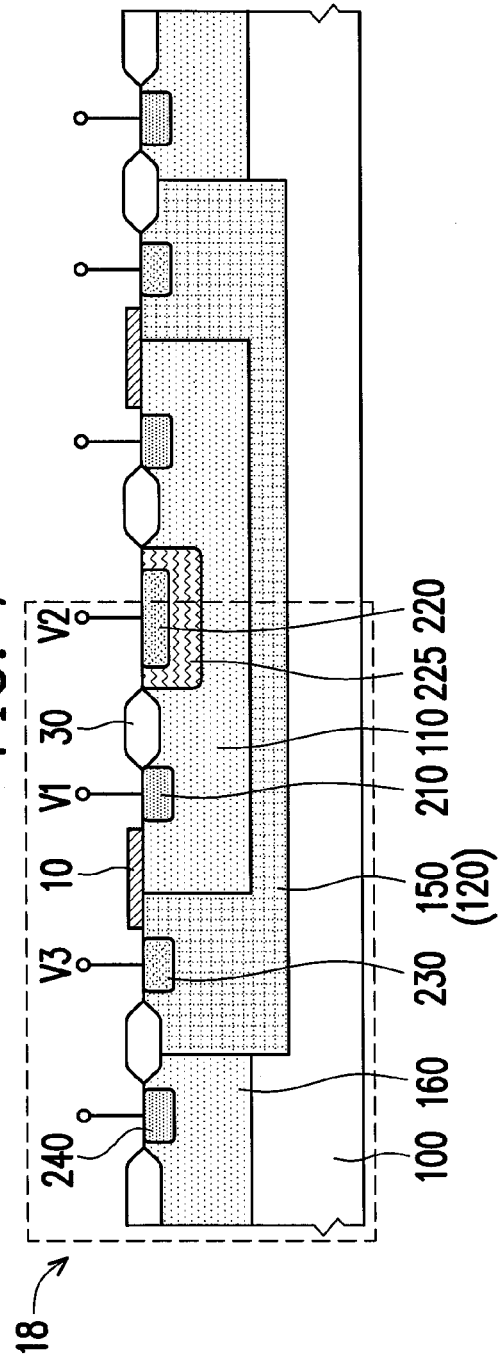
FIG. 8 is a cross-sectional diagram of a semiconductor device according to eighth embodiment of the invention.

FIG. 7 is a cross-sectional diagram of a semiconductor device according to seventh embodiment of the invention. FIG. 8 is a cross-sectional diagram of a semiconductor device according to eighth embodiment of the invention. FIG. 9 is a cross-sectional diagram of a semiconductor device according to ninth embodiment of the invention.

Referring to FIG. 7 to FIG. 9, semiconductor devices 17, 18 and 19 of seventh to ninth embodiments are similarly to the semiconductor devices 11, 12 and 13 of first to third embodiments respectively, and differences thereof are that the separation region 120 is a deep well region 150 of the second conductive type. A dopant of the deep well region 150 is, for example, phosphorous or arsenic, and a doping concentration of the deep well region 150 is, for example, $5\times10^{14}/cm^3$ to $8\times10^{17}/cm^3$. The deep well region 150 may be applied in a triple well or a multiple well process. The doping concentration of the deep well region 150 may be less than the doping concentration of the second well region 130 and the buried layer 140 for raising the breakdown voltage.

Figure 11:
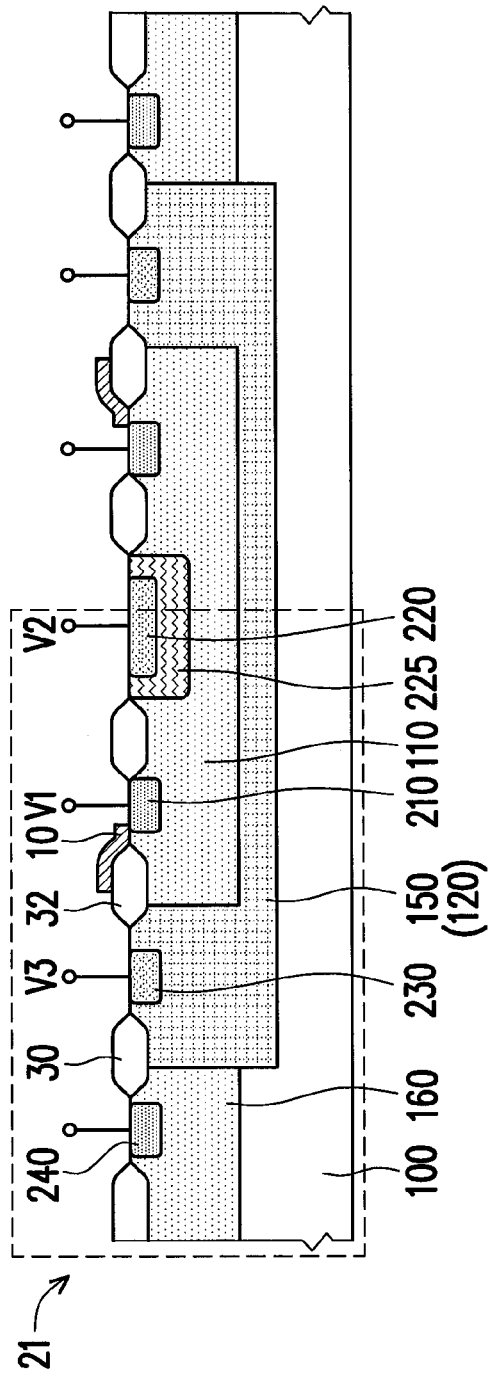
FIG. 11 is a cross-sectional diagram of a semiconductor device according to eleventh embodiment of the invention.
Figure 12:
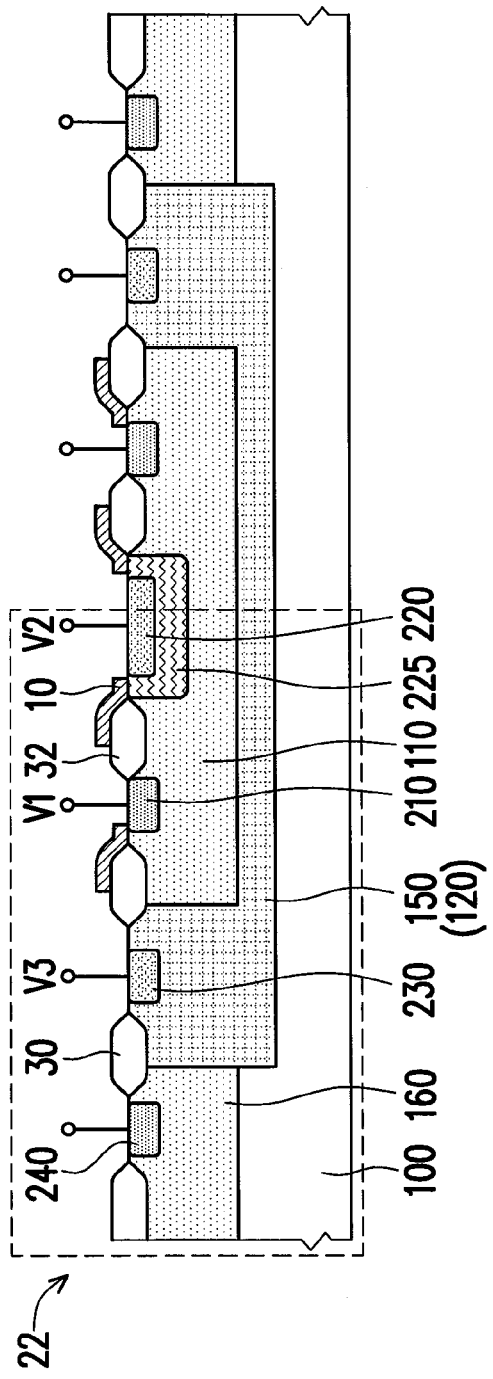
FIG. 12 is a cross-sectional diagram of a semiconductor device according to twelfth embodiment of the invention.

FIG. 10 is a cross-sectional diagram of a semiconductor device according to tenth embodiment of the invention. FIG. 11 is a cross-sectional diagram of a semiconductor device according to eleventh embodiment of the invention. FIG. 12 is a cross-sectional diagram of a semiconductor device according to twelfth embodiment of the invention.

Referring to FIG. 10 to FIG. 12, semiconductor devices 20, 21 and 22 of tenth to twelfth embodiments are similarly to the semiconductor devices 17, 18 and 19 of seventh to ninth embodiments respectively, and differences thereof are that the semiconductor devices 20, 21 and 22 of tenth to twelfth embodiments further include the isolation structure 32 disposed below the field plate 10, and the field plate 10 covers a part of the isolation structure 32.

A method of fabricating the semiconductor device of the invention is described below with reference to FIG. 1.

Referring to FIG. 1, the substrate 100 of the first conductive type is provided. A material of the substrate 100 is, for example, a semiconductor material. The semiconductor material is, for example, a material composed of at least one material selected form a group consisting of Si, Ge, SiGe, GaP, GaAs, SiC, SiGeC, InAs and InP, a SOI, or any other physical structures suitable for the process of the invention.

A first well region 110 of the first conductive type is formed in the substrate 100. A method of forming the first well region 110 includes forming an ion implant mask on the substrate 100 first, and performing an ion implantation process to implant dopants into the substrate 100, followed by performing an annealing process. In an embodiment, a dopant of the first well region 110 is, for example, boron and boron difluoride, and a doping dosage of the first well region 110 is, for example, $8.00 \times 10^{11}/cm^2$ to $8.00 \times 10^{13}/cm^2$.

The separation region 120 of a second conductive type is formed in the substrate 100, in which the first well region 110 is disposed in the separation region 120. More specifically, a method of forming the separation region 120 includes forming a second well region 130 of the second conductive type at peripheral of the first well region 110. A buried layer 140 of the second conductive type is formed in the substrate 100 below the first well region 110 and the second well region 130. A method of forming the second well region 130 and the buried layer 140 includes forming an ion implant mask on the substrate 100 first, and performing an ion implantation process to implant dopants into the substrate 100, followed by performing an annealing process. Sequence for forming the second well region 130 and the buried layer 140 may be adjusted according to actual demands without any particular limitation. A doping concentration of the buried layer 140 may be different from a doping concentration of the second well region 130. In an embodiment, a dopant of the buried layer 140 and the second well region 130 is, for example, phosphorous or arsenic, and a doping dosage of the buried layer 140 is, for example, $1.00 \times 10^{12}/cm^2$ to $8.00 \times 10^{14}/cm^2$; and a doping dosage of the second well region 130 is, for example, $1.00 \times 10^{12}/cm^2$ to $1.00 \times 10^{14}/cm^2$.

In an embodiment, the semiconductor device of the invention further includes an outer well region 160 of the first conductive type. The outer well region 160 surrounds at peripheral of the separation region 120. A method of forming the outer well region 160 includes forming an ion implant mask on the substrate 100 first, and performing an ion implantation process to implant dopants into the substrate 100, followed by performing an annealing process. In an embodiment, a dopant of the outer well region 160 is, for example, boron and boron difluoride, and a doping dosage of the outer well region 160 is, for example, $1.00 \times 10^{12}/cm^2$ to $5.00 \times 10^{13}/cm^2$. Moreover, the outer well region 160 and the first well region 110 may be simultaneously formed.

A first doped region 210 of the first conductive type is formed in the first well region 110. The first doped region 210 may be formed by performing an ion implantation process to implant dopants into the substrate 100, followed by performing an annealing process. In an embodiment, a dopant of the first doped region 210 is, for example, boron and boron difluoride, and a doping dosage of the first doped region 210 is, for example, $8 \times 10^{14}/cm^2$ to $8.00 \times 10^{15}/cm^2$.

A lightly doped region 225 is disposed in the first well region 110 at a first side of the first doped region 210. The lightly doped region 225 may be formed by performing an ion implantation process to implant dopants into the substrate 100, followed by performing an annealing process. A doping concentration of the lightly doped region 225 is between the doping concentration of the separation region 120 and the doping concentration of the second doped region 220. A doping dosage of the lightly doped region 225 is, for example, $10.00 \times 10^{13}/cm^2$ to $8.00 \times 10^{14}/cm^2$; a doping dosage of the separation region 120 is, for example, $1.00 \times 10^{13}/cm^2$ to $1.10 \times 10^{13}/cm^2$; and a doping dosage of the second doped region 220 is, for example, $8.00 \times 10^{14}/cm^2$ to $8.00 \times 10^{15}/cm^2$.

The second doped region 220 of the second conductive type is formed in the lightly doped region 225, and a third doped region 230 of the second conductive type is formed in the separation region 120 at a second side of the first doped region 210. The second doped region 220 and the third doped region 230 may be formed by performing an ion implantation process to implant dopants into the substrate 100, followed by performing an annealing process. In an embodiment, a dopant of the second doped region 220 and the third doped region 230 is, for example, boron and boron difluoride, and a doping dosage of the second doped region 220 is, for example, $8.00 \times 10^{14}/cm^2$ to $8.00 \times 10^{15}/cm^2$.

In an embodiment, the method fabricating the semiconductor device of the invention further includes forming a fourth doped region 240 of the first conductive type in the outer well region 160. The fourth doped region 240 may be formed by performing an ion implantation process to implant dopants into the substrate 100, followed by performing an annealing process. In an embodiment, a dopant of the fourth doped region 240 is, for example, boron and boron difluoride, and a doping dosage of the fourth doped region 240 is, for example, $8 \times 10^{14}/cm^2$ to $8 \times 10^{15}/cm^2$. The fourth doped region 240 and the first doped region 210 may be simultaneously formed.

Referring to FIG. 1, an isolation structure 30 is formed on the substrate 100 between the first doped region 210 and the second doped region 230, on the substrate 100 between the third doped region 230 and the fourth doped region 240, and on the substrate 100 at outer side of the fourth doped region 240, respectively. The isolation structure 30 includes a local oxidation structure, a shallow trench isolation structure, and a deep trench isolation structure. The field plate 10 is formed on the lightly doped region 225 and the first well region 110 between the first doped region 210 and the second doped region 220, so that the field plate 10 is in contact with the lightly doped region 225. The field plate 10 may cover a part of the second doped region 220, or may not cover the second doped region 220 at all.

A fabricating method of the semiconductor devices 12 and 13 depicted in FIG. 2 and FIG. 3 is similar to the fabricating method of the semiconductor device 11 depicted in FIG. 1, a difference thereof is that positions of the field plate 10 and the isolation structure 30 are different.

A fabricating method of the semiconductor devices 14 to 16 depicted in FIG. 4 to FIG. 6 is similar to the fabricating method of the semiconductor devices 11 to 13 of first to third embodiments, a difference thereof is that the semiconductor devices 14 to 16 further include an isolation structure 32 formed below the field plate 10. The isolation structure 32 and the isolation structure 30 may be simultaneously formed.

A fabricating method of the semiconductor devices 17 to 19 depicted in FIG. 7 to FIG. 9 is similar to the fabricating method of the semiconductor devices 11 to 13 of first to third embodiments, a difference thereof is that the separation region 120 is a deep well region 150 of the second conductive type. The deep well region 150 may be formed by performing an ion implantation process to implant dopants into the substrate 100, followed by performing an annealing process.

A fabricating method of the semiconductor devices 20 to 22 depicted in FIG. 10 to FIG. 12 is similar to the fabricating method of the semiconductor devices 17 to 19 depicted in FIG. 7 to FIG. 9, a difference thereof is that the semiconductor devices 20 to 22 further include an isolation structure 32 formed below the field plate 10. The isolation structure 32 and the isolation structure 30 may be simultaneously formed.

Based on above, in the invention, by disposing the second doped region (e.g., the emitter) in the lightly doped region, a concentration of the second doped region (e.g., the emitter) may be increased to improve the common-emitter current gain of the semiconductor device while maintaining the high breakdown voltage of the device. Furthermore, in the invention, by disposing the field plate on the substrate between each of the doped regions, the potential distribution inside of the semiconductor device may be uniform, and the breakdown voltage of the junction thereof may also be raised.

In addition, the fabricating method of the semiconductor device of the invention is compatible with existing standard processes to be applied in any processes or any operating voltage without adding extra photomask, and capable of raising the breakdown voltage of the semiconductor device.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A semiconductor device, comprising:
   a substrate of a first conductive type;
   a first well region of the first conductive type, disposed in the substrate;
   a separation region of a second conductive type, disposed in the substrate, wherein the first well region is disposed in the separation region, wherein the separation region comprises:
   a second well region of the second conductive type, disposed at peripheral of the first well region; and
   a buried layer of the second conductive type, disposed in the substrate below the first well region and the second well region, wherein a doping concentration of the buried layer is different from a doping concentration of the second well region;
   a first doped region of the first conductive type, disposed in the first well region and a first voltage being applied to the first doped region;
   a second doped region of the second conductive type, disposed in the first well region at a first side of the first doped region, and a second voltage being applied to the second doped region;
   a third doped region of the second conductive type, disposed in the separation region at a second side of the first doped region, and a third voltage being applied to the third doped region; and
   at least one field plate disposed on the substrate between the first doped region and the second doped region, or disposed on the substrate between the first doped region and the third doped region.

2. The semiconductor device of claim 1, wherein the separation region comprises a deep well region of the second conductive type.

3. The semiconductor device of claim 1, wherein when the first conductive type is a P-type and the second conductive type is an N-type, the third voltage is greater than the first voltage and the first voltage is greater than the second voltage.

4. The semiconductor device of claim 1, wherein when the first conductive type is an N-type and the second conductive type is a P-type, the second voltage is greater than the first voltage and the first voltage is greater than the third voltage.

5. The semiconductor device of claim 1, further comprising at least one isolation structure disposed below the at least one field plate, and the at least one field plate covering a part of the at least one isolation structure.

6. The semiconductor component of claim 1, wherein a material of the at least one field plate comprises a polysilicon, a metal or a combination thereof.

7. A semiconductor device, comprising:
   a substrate of a first conductive type;
   a first well region of the first conductive type, disposed in the substrate;
   a separation region of a second conductive type, disposed in the substrate, wherein the first well region is disposed in the separation region;
   a first doped region of the first conductive type, disposed in the first well region;
   a lightly doped region of the second conductive type, disposed in the first well region at a first side of the first doped region;
   a second doped region of the second conductive type, disposed in the lightly doped region;
   a third doped region of the second conductive type, disposed in the separation region at a second side of the first doped region; and
   at least one field plate disposed on the substrate between the first doped region and the second doped region and in contact with the lightly doped region, or disposed on the substrate between the first doped region and the third doped region.

8. The semiconductor device of claim 7, wherein the separation region comprises:
   a second well region of the second conductive type, disposed at peripheral of the first well region; and
   a buried layer of the second conductive type, disposed in the substrate below the first well region and the second well region, wherein a doping concentration of the buried layer is different from a doping concentration of the second well region.

9. The semiconductor device of claim 7, wherein the separation region comprises a deep well region of the second conductive type.

10. The semiconductor device of claim 7, wherein a doping concentration of the lightly doped region is between the doping concentration of the separation region and the doping concentration of the second doped region.

11. The semiconductor device of claim 7, wherein when the first conductive type is a P-type, the second conductive type is an N-type; and when the first conductive type is the N-type, the second conductive type is the P-type.

12. The semiconductor device of claim 7, further comprising at least one isolation structure disposed below the at least one field plate, and the at least one field plate covering a part of the at least one isolation structure.

13. The semiconductor component of claim 7, wherein a material of the at least one field plate comprises a polysilicon, a metal or a combination thereof.

14. A method of fabricating a semiconductor device, comprising:
   providing a substrate of a first conductive type;
   forming a first well region of the first conductive type in the substrate;
   forming a separation region of a second conductive type in the substrate, wherein the first well region is disposed in the separation region;
   forming a first doped region of the first conductive type in the first well region;
   forming a lightly doped region of the second conductivity type in the first well region at a first side of the first doped region;
   forming a second doped region of the second conductivity type in the lightly doped region;
   forming a third doped region of the second conductivity type in the separation region at a second side of the first doped region; and
   forming at least one field plate on the substrate between the first doped region and the second doped region and in contact with the lightly doped region, or on the substrate between the first doped region and the third doped region.

15. The method of fabricating the semiconductor device of claim 14, wherein the step of forming the separation region comprises:
   forming a second well region of the second conductive type at peripheral of the first well region; and
   forming a buried layer of the second conductive type in the substrate below the first well region and the second well region, wherein a doping concentration of the buried layer is different from a doping concentration of the second well region.

16. The method of fabricating the semiconductor device of claim 14, wherein the step of forming the separation region comprises forming a deep well region of the second conductive type.

17. The method of fabricating the semiconductor device of claim 14, further comprising forming at least one isolation structure below the at least one field plate, and the at least one field plate covering a part of the at least one isolation structure.

18. The method of fabricating the semiconductor device of claim 14, wherein a material of the at least one field plate comprises a polysilicon, a metal or a combination thereof.

19. The method of fabricating the semiconductor device of claim 14, wherein a doping concentration of the lightly doped region is between the doping concentration of the separation region and the doping concentration of the second doped region.

* * * * *